United States Patent [19]
Osipov et al.

[11] 3,995,135
[45] Nov. 30, 1976

[54] APPARATUS FOR SOLDERING ROW OF CONDUCTORS ONTO BOARD

[76] Inventors: Anatoly Alexandrovich Osipov, proezd Kadomtseva, 7, kv. 26; Nikolai Semenovich Pekov, ulitsa B. Mariinskaya, 2, kv. 77; Petr Pavlovich Semenov, Leninsky prospekt, 91, kv. 169, all of Moscow, U.S.S.R.

[22] Filed: Jan. 17, 1975
[21] Appl. No.: 541,921

[52] U.S. Cl. .............................. 219/85 D; 219/85 F; 219/88; 228/55
[51] Int. Cl.² ........................................... B23K 3/00
[58] Field of Search..... 33/1 M; 219/85 BA, 85 CA, 219/85 D, 85 F, 85 G, 88, 124, 125 R; 269/67, 68, 69, 70; 408/237; 228/55

[56] References Cited
UNITED STATES PATENTS

| | | |
|---|---|---|
| 3,400,448 | 9/1968 | Helda et al. .................... 219/85 F |
| 3,458,102 | 7/1969 | Zanger et al. ................. 219/85 F X |
| 3,567,950 | 3/1971 | Meyer ............................. 33/1 M X |
| 3,774,311 | 11/1973 | Stemple .......................... 33/1 M X |

*Primary Examiner*—J. V. Truhe
*Assistant Examiner*—N. D. Herkamp
*Attorney, Agent, or Firm*—Haseltine, Lake & Waters

[57] ABSTRACT

The present invention relates to the manufacture of radio-electronic equipment. The proposed apparatus for soldering a row of conductors onto a board comprises a housing having a table for a board to be arranged thereon, and a soldering head kinematically coupled to a carriage driven by a drive mechanism. The soldering head is kinematically coupled to the carriage by means of a rod adapted for movement in the carriage and having a holder, the soldering head being spring-loaded and arranged in the holder.

3 Claims, 3 Drawing Figures

APPARATUS FOR SOLDERING ROW OF CONDUCTORS ONTO BOARD

The present invention relates to the manufacture of radio-electronic equipment and, more particularly, to an apparatus for soldering a row of conductors onto a board, which conductors may be, for example, integrated circuit terminals.

The process of soldering a row of conductors onto a board necessarily includes the operation of successively matching the conductors being soldered with the soldering tool. The method of matching largely determines the productivity of soldering (or welding) apparatus and their design.

There are known apparatus for soldering onto a board a row of conductors, in particular, integrated circuit terminals, which apparatus comprise a housing having a table for a board being arranged thereon, and a soldering head kinematically connected to a carriage driven by a drive mechanism.

However, in the known apparatus the detection of contact locations and the connection of conductors to a board are effected by programmed movement of the soldering head and movement of the table with the board arranged thereon, which two movements proceed in mutually perpendicular directions.

It is only natural that to raise the productivity of such apparatus, it is necessary to increase the speed of these movements, which speed is limited by considerable dynamic loads in the movable elements of the apparatus which develop as a result of bringing said apparatus into action and stopping it.

Such loads are felt the most strongly in the board shifting mechanism which has to move, apart from the board and the attachment for holding said board, a number of other heavy parts, including the table, drive elements, etc.

This requires an increased stiffness of the housing, an increased power of the drive, and the inclusion in the apparatus of a number of safety and shock absorbing means.

As a result, the apparatus of the above type are marked by a complicated structure, which accounts for their low reliability. In addition, they have a great size and weight and thus require much floor space.

It is an object of the present invention to provide a soldering apparatus that would be free of the above disadvantages.

The invention essentially aims at providing a structurally simple apparatus for soldering a row of conductors onto a board, which apparatus would ensure fast positioning and locking of the soldering head at any point above the board with subsequent automatic shifting of said soldering head over the conductors being soldered without using any programming devices.

The foregoing object is attained by providing an apparatus for soldering a row of conductors onto a board, comprising a housing having a table for a board to be arranged thereon, and a soldering head kinematically connected to a carriage driven by a drive mechanism, in which device the kinematic connection between the carriage and the soldering head is effected, according to the invention, by means of a rod arranged in the carriage and adapted to move in the plane parallel with the plane of the table rigidly mounted on the housing and perpendicularly to the movement of the carriage, said rod having a holder housing the soldering head which is spring-loaded, and a check constructed as a cam interacting with the soldering head and a button to control a locking means for said rod, which locking means is mounted on said carriage.

It is expedient that the rod locking means be constructed as an electromagnet whose armature rests on a pawl interacting with said rod.

It is also expedient that the apparatus of this invention be provided with a master form constructed as a strip mounted on the rod, said strip having holes to receive the pawl of the locking means for fixing the position of the rod.

Thus, the proposed apparatus is highly effective and is at the same time very simple in design, highly reliable in operation and easy to service.

Other objects and advantages of the present invention will become more apparent from the following detailed description of a preferred embodiment thereof to be read in conjunction with the accompanying drawings, wherein.

Referring now to the attached drawings, the proposed apparatus for soldering a row of conductors onto a board comprises a housing 1 (FIG. 1) having an instrument panel 2 and a table 3 arranged whereon is a board 4 with microcircuits 5 to be mounted on the board 4.

Figure 2:
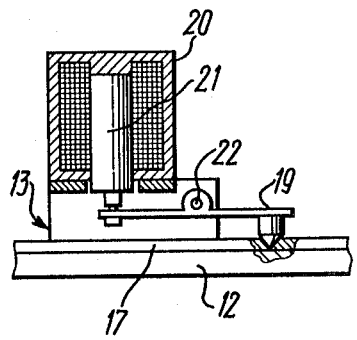
FIG. 2 is a sectional view of the rod locking means in accordance with the invention.

Secured inside the housing 1, parallel to the plane of the table 3, is a guide 6. Mounted on the guide 6 is a carriage 7, and latter being coupled by means of a cable 8 passing through guide rollers 9 to a drum 10 of a drive mechanism 11. Mounted on the carriage 7 are a rod 12 adapted to move in the plane parallel with the plane of the table 3 and perpendicularly to the direction of movement of the carriage 7, and locking means 13 for fixing the position of the rod 12. Mounted at one end of the rod 12 is a holder 14 with a soldering head 15 and a check 16. In addition, the rod 12 is provided with an optional master form 17 which is constructed as a strip having holes 18 to receive a pawl 19 (FIG. 2) of the locking means 13.

In the exemplary inventive embodiment the holes 18 (FIG. 1) in the master form 17 are spaced at a distance equal to that between rows of the microcircuits 5 on the board 4. However, if the microcircuits 5 are arranged arbitrarily, the positioning of the holes 18 in the master form 17 must correspond to the positioning of the microcircuits 5 in the direction of the movement of the rod 12 in the carriage 7.

The locking means 13 for fixing the position of the rod 12 is an electromagnet 20 (FIG. 2) whose armature 21 is operably connected to one of the shoulders of the pawl 19 mounted on an axle 22.

Figure 3:
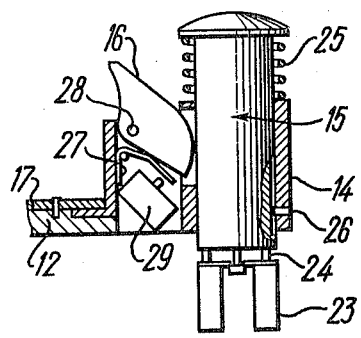
FIG. 3 is a sectional view of a holder with a soldering head in accordance with the invention.

The soldering head 15 (FIG. 3) comprises two soldering tips 23 mounted on levers 24 and adapted for limited movement in the vertical plane. It is clear that the soldering head 15 may be of any known design.

The head 15 is arranged in the holder 14 and is also adapted for movement in the vertical plane, being moved downward by hand, and upward, by a spring 25. The movement of the head 15 is restricted by a stop 26.

Spontaneous lifting of the head 15 is preventing by the check 16 abutting against a spring 27, which check 16 wedges the head 15. The check 16 is constructed as a cam whose shape is eccentrical with respect to an axle 28 about which said cam rotates. The portion of the check 16 which projects from the holder 14 has a recess to receive the pawl. Arranged below the check 16 is a button 29 connected to the circuit of the electromagnet 20 (FIG. 2) of the locking means 13 for fixing the position of the rod 12.

The proposed apparatus operates as follows.

The board 4 (FIG. 1) with the microcircuits 5 thereon is placed on the table 3.

Pressing upon the check 16 (FIG. 3), the spring 27 switches the button 29 to the "on" position, and the electromagnet 20 (FIG. 2) of the locking means 13 for fixing the position of the rod 12 is de-energized. As this takes place, the armature 21 descends under its own weight, and the pointed tip of the pawl 19 leaves the hole 18 of the master form 17, thus releasing the rod 12 in the carriage 7.

Figure 1:
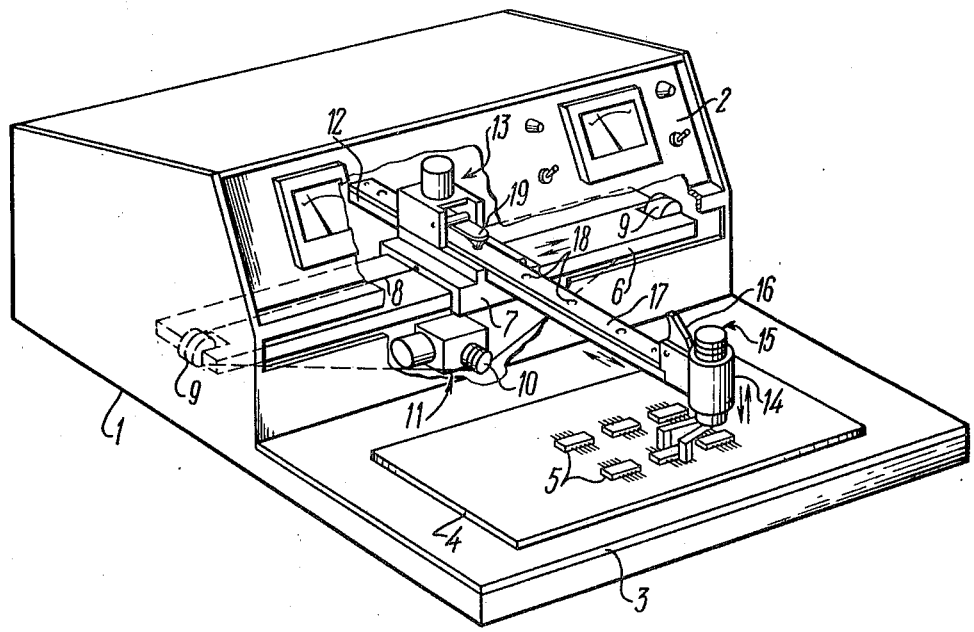
FIG. 1 is a schematic general exonometrical view of an apparatus for soldering a row of conductors onto a board (with a partially cut-away housing) in accordance with the invention.

Thus, when the check 16 is pressed upon by the spring and the drive mechanism 11 is switched off, the soldering head 15 can freely move in three mutually perpendicular directions (indicated by arrows in FIG. 1).

Without releasing the pressure on the check 16, the soldering head is roughly positioned above the microcircuit 5 at the beginning of the row. Upon releasing the check 16, the interaction between the pawl 19 of the locking means 13 with the hole 18 in the master form 17 ensures symmetrical positioning of the soldering tips 23 with respect to the microcircuit 5. In this position, the soldering head 15 is lowered until it reaches the stop 26, which provides for a small clearance between the board 4 and the soldering tips 23. Then the drive mechanism 11 is put into action.

Simultaneously with an switching on of the drive mechanism 11, the electromagnet (not shown) of the soldering head 15 releases the levers 24 of the soldering tips 23, which latter solder the terminals of the microcircuits 5 to the board 4 in the course of automatic movement of the soldering head 15.

As soon as the soldering of the last microcircuit 5 in the row is over, the drive mechanism 11 is switched off, and the soldering tips 23 are lifted above the board 4.

By pressing the check 16, the soldering head 16 is moved to the next row. Indicated in FIG. 1 are two rows of microcircuits 5. In the course of all its movements, the soldering head 15 is in the extreme upper position in the holder 14, which rules out the possibility of damage of the microcircuits 5 by the soldering tips 23.

In the proposed apparatus the time lag of the movable components is reduced to a minimum because the table is rigid, whereas the soldering head that moves relative to the board has small weight and size. The operator only has to press the check to rapidly and easily position the soldering head above the conductors to be soldered, without breaking the kinematic coupling between the soldering head and the drive mechanism.

This makes it possible to simplify the structure of the novel apparatus and reduce its weight and size.

What is claimed is:

1. An apparatus for soldering a row of conductors onto a board, comprising: a housing having a table to hold a bore with microcircuits thereon; a stationary guide rigidly secured in said housing, parallel with said table; a carriage movably mounted on said guide; a rod arranged in said carriage; means for imparting movement to said rod in a direction perpendicular to that of the carriage movement; locking means mounted on said carriage for fixing the position of said rod; a holder mounted at one end of said rod; a spring-loaded soldering head arranged in said holder; means for imparting movement to said head in a direction perpendicular to the plane of said table; a check for said soldering head, and a control button for said locking means, said check and said button being also arranged in said holder and operably interconnected; and a drive mechanism kinematically coupled to said carriage for moving the same.

2. The apparatus as defined in claim 1, wherein said locking means includes an electromagnet having an armature and a pawl, one end of said pawl interacting with said armature, and the other end at least indirectly with said rod.

3. The apparatus as defined in claim 2, further comprising a master form mounted on said rod and constructed as a strip having holes to receive said other end of the pawl.

* * * * *